United States Patent [19]
Kuzyk

[11] 3,885,170
[45] May 20, 1975

[54] METHOD FOR MOTOR CONTROL

[76] Inventor: Roman Kuzyk, 436 Schiller Ave., Trenton, N.J. 08610

[22] Filed: May 25, 1973

[21] Appl. No.: 363,977

[52] U.S. Cl. ...... 307/252 UA; 307/235; 307/252 B; 307/270
[51] Int. Cl. .......... H03k 17/00
[58] Field of Search ......... 307/252 B, 252 UA, 218, 307/235, 237; 318/432, 433, 434

[56] References Cited

UNITED STATES PATENTS

| | | | |
|---|---|---|---|
| 3,424,967 | 1/1969 | Keller | 318/432 |
| 3,506,852 | 4/1970 | Hart | 307/252 |
| 3,633,094 | 1/1972 | Clements | 307/252 |
| 3,662,190 | 5/1972 | Naber | 307/252 |
| 3,750,000 | 7/1973 | Brucker et al. | 318/435 |

*Primary Examiner*—Michael J. Lynch
*Assistant Examiner*—B. P. Davis
*Attorney, Agent, or Firm*—Fulwider, Patton, Rieber, Lee & Utecht

[57] ABSTRACT

An inductive load sensing circuit associated with triac switched electrical motors including signal means for providing an electrical signal indicative of the switching voltage of the triac, an AND gate connected to receive the signal means output signal and the gating signal to the triac, and means interposed between the AND gate and the signal means for adjusting the signal level of the signal means.

6 Claims, 4 Drawing Figures

METHOD FOR MOTOR CONTROL

BACKGROUND OF THE INVENTION

1. Field of the Invention:

The present invention relates to electronic controllers and more particularly to controllers responsive to the phase lag of an operating instrument.

2. Description of the Prior Art:

In electro-mechanical applications, and particularly in applications where the inductive characteristics of an A.C. circuit are utilized to power mechanical apparatus, the mechanical loading on the inductive device generally has a correlation with the current phase lag of the load. Typically as the loading is increased the phase lag developed across the inductor decreases and any switching circuitry which is combined with the inductive load originally set to switch over at zero crossing, will be switching over at non-zero signal levels. Heretofore this particular feature of an inductive circuit switched according to the voltage level of the input supply has not been utilized to discriminate between loading conditions of an inductive load. Generally overload conditions have been sensed through the RMS current levels and similar devices while parallel efforts were directed at reducing the electrical noise emitted due to the non-zero cross-over switching of the switching circuit.

SUMMARY OF THE INVENTION

Accordingly it is the general purpose and object of the present invention to utilize the voltage levels of switching for control to determine the loading of an inductive load. Yet another object of the invention is to utilize standard circuit elements to provide any desired overload indication.

Briefly these and other objects of the present invention are accomplished by connecting an inductive load in series with a bi-directional switching device, such as a triac, gated by a zero cross-over pulse circuit to switch at a preselected phase relationship with the A.C. input signal. The pulse circuit is phase connected to the A.C. signal by an RC network selected to provide a phase shift corresponding to the nominal operating phase shift of the load. At the output end the pulse circuit gates the triac in series with the load, thus switching the conductive direction of the load according to the phase shifted zero crossings of the A.C. signal. Accordingly the triac is gated to switch concurrent with the zero crossings of the phase shifted reference and any changes in the loading will register as non-zero voltages on the output of the triac concurrent with the phase shifted switch-over. These voltages are then picked up across a voltage divider or a potentiometer and collected at an AND gate together with the ON signal to the control system, the AND gate producing an output if the voltage level concurrent with the switch-over exceeds a predetermined voltage. Thus any desired phase shift exhibited by an inductive load can be selected by the potentiometer to produce a logical 1 at the output of the AND gate when exceeded. In this manner any selected load condition can be set to produce an exceedance signal, such as an alarm signal, pulling the inductive load off the line or operating other equipment in association therewith.

Other objects and features of the invention will become apparent from consideration of the following description taken in connection with the accompanying drawing.

DESCRIPTION OF THE SPECIFIC EMBODIMENT

Figure 1:
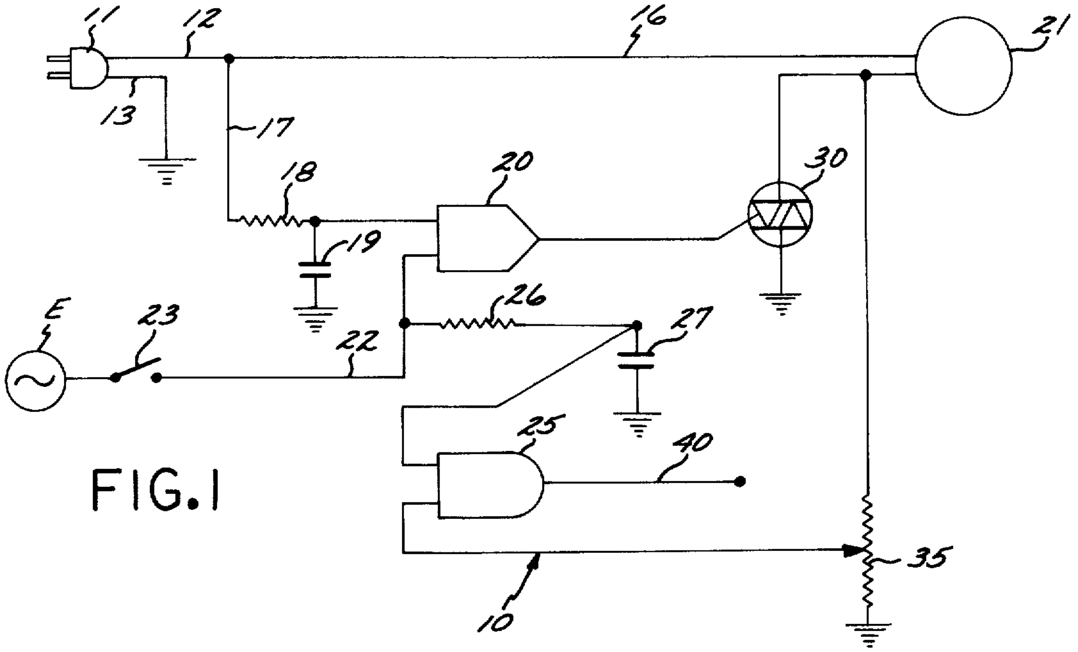
FIG. 1 is a circuit schematic of the embodiment constructed according to the present invention.

Shown in FIG. 1 is an indicating system generally designated 10 adapted to be connected to a conventional A.C. source of electrical power (not shown) by a conventional two-terminal plug 11. Plug 11, at the output thereof, connects to two conductors, respectively attaching to the corresponding terminals of the plug, the conductors being generally designated as conductors 12 and 13. Conductor 13 conventionally forms the return path of the circuit, illustrated as being connected to ground, where the ground connection is for convention purposes only and any common return connecting all of the ground terminals in the embodiment will provide this function. Conductor 12 connects at the other end to two parallel conductors 16 and 17 where conductor 16 connects to one terminal of an inductive device such as a motor 21. The other end of conductor 17 is connected to a conventional resistor 18 which at the output connects both across a capacitor 19 to ground and to a one input terminal of a conventional pulse circuit 20 providing a pulse concurrent with the zero crossing of the signal at the output of resistor 18. Pulse circuit 20 can be any conventional integrated circuit designed for this purpose, such as the circuit designated as Model No. CA 3058 distributed and manufactured by the Radio Corporatiton of America. The pulse circuit 20 further receives at the second input terminal thereof an enabling signal or an ON signal carried by a conductor 22 connected across a switch 23 to a source of power E. Also connected to the second terminal of pulse circuit 20 is one end of a resistor 26 which at the other end is connected to the input of a conventional AND gate 25 and across a capacitor 27 to ground. Resistor 26 and capacitor 27 are selected to provide a predetrmined time constant, or lag, following the closure of switch 23.

The output of pulse circuit 20 connects to the gate terminal of a triac 30 which when energized by the pulse circuit 20 applies a current signal removing the breakover region of the voltage characteristics between the open gate breakover and conduction in either direction of the triac, such being the common characteristics of a triac. In this manner pulse circuit 20 gates the triac to conuct a particular portion of a cycle in either direction. Triac 30 is further connected in series between the output terminal of motor 21 to ground, completing the circuit across motor 21 and thus providing the requisite field switching or armature switching in the motor. Connected in parallel across triac 30 is a variable resistor or potentiometer 35 also connecting to ground at the other side thereof, which at the wiper is connected to provide the second input to AND gate 25. Thus the voltage divider function of potentiometer 35 provides a means for adjusting the voltage level to the AND gate 25, thereby accommodating in a conventional manner any input impedence of the AND gate while also selecting the level of the voltage that will gate the AND gate. In this manner any selected voltage can be set by adjustment of potentiometer 35 to turn AND gate 25 on whenever the triac 30 is switched above a predetermined voltage. AND gate 25 therefore provides either a logical 0 output signal at terminal 40 when the switching voltage, i.e., the selected voltage across potentiometer 35, is below the voltage level required to gate AND gate 25. Furthermore resistor 26 and capacitor 27 provide a time delay during which AND gate 25 is rendered inoperative to provide an inactivated aperture during start up such that the phase shifts typically associated with start up do not trigger the control signal 40.

Figures 2, 3, 4:
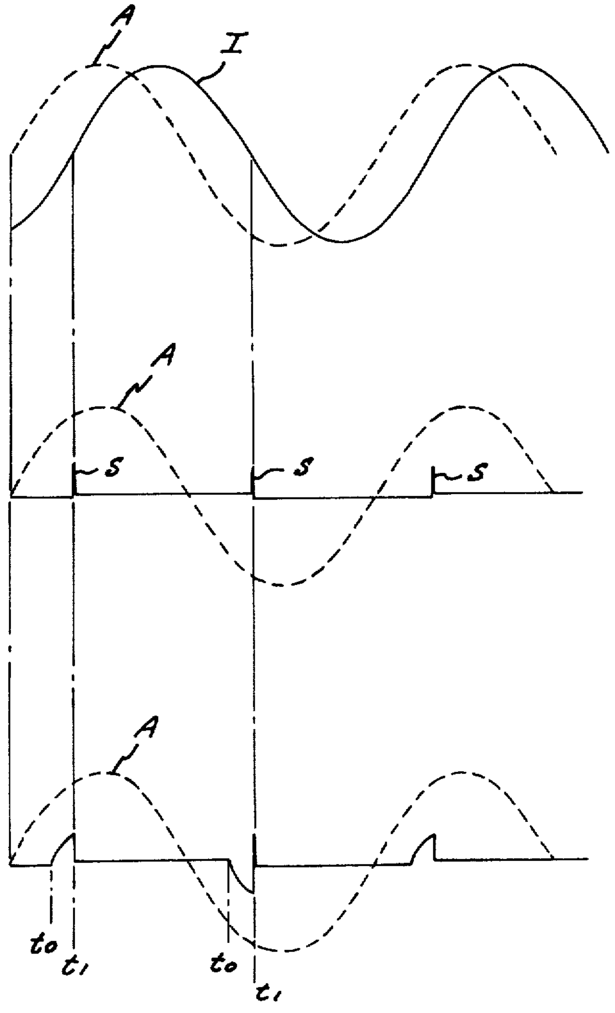
FIG. 2 is a time-amplitude chart of the current and voltage signals at a phase shift corresponding to the nominal loading of the circuit of FIG. 1.
FIG. 3 is a time-amplitude chart corresponding to the switching signal relationship with the reference voltage.
FIG. 4 is a time-amplitude chart corresponding to the voltage occurring during switch-over of the triac of FIG. 1.

The operation of the present invention will now be set forth with reference to FIG. 1 and with particular references to FIGS. 2, 3 and 4. Generally an inductive load such as motor 21 produces a current lag when referenced to the A.C. voltage signal. As the loading on the motor 21 is increased the inductive reactance of the motor decreases and the phase lag is reduced. Accordingly the phase lag between the voltage signal A of FIG. 2 and the current signal I tend to coalesce with an increase in load. The selection of resistor 18 and capacitor 19 furthermore provides a phase lag to the input of the pulse circuit 20 which is concurrent with the zero crossings of the signal I across motor 21. Specifically in FIG. 3 such switching signals are indicated as switching signals S occurring at time $t_1$ within each cycle of the voltage signal A. As the load on motor 21 is increased beyond the nominal running load set in by resistor 18 and capacitor 19 the zero crossings of the current signal I are phase shifted towards the phase of the voltage signal A to occur at time $t_0$ as indicated in FIG. 4. Thus the switching of the triac 30 occurs at non-zero voltage levels across resistor 35 which can be selectively adjusted to gate the AND gate 25. In this manner an overload indicating system can be formed utilizing conventional circuit elements which discriminates between a normal condition and an overload condition selected by the setting of potentiometer 35 according to the nonlinear switching logic of the AND gate. This switching signal is then available to activate any safety devices or control circuits associated with the circuit.

Some of the many advantages of the present invention should now be readily apparent. The invention provides apparatus by which any convenient nominal operating range can be selected which when exceeded will provide a digital or nonlinear indicating signal which can be used for purposes of control or display or both. Furthermore these features of the invention are accomplished with readily available commercial parts realizing a reduction in cost and simplicity heretofore not available in other circuits of this type.

Obviously many modifications and variations of the present invention may be made with regard to the foregoing detailed description without departing from the spirit of the invention.

I claim:

1. Apparatus for providing electrical signals indicative of the loading on an inductive device comprising:

switch means for selectively producing an enabling signal;

means for switching the inductive device at a predetermined phase angle relative the zero crossings of an A.C. electrical input signal, upon concurrent receipt of said enabling signal;

resistive means connected across said means for switching producing voltage signals indicative of the current lag thereacross; and gate means connected to receive said voltage signals and said enabling signal for producing an output signal when said voltage signals are above a predetermined magnitude concurrent with the presence of said enabling signal.

2. Apparatus according to claim 1 wherein:

said means for switching include a phase lag circuit for producing an output signal at said predetermined phase angle relative said A.C. electrical signal.

3. Apparatus according to claim 2 wherein:

said phase lag circuit includes resistive and capacitive circuit elements.

4. Apparatus according to claim 1 further including:

time delay means connected to said gate means for disabling said gate means for a predetermined time period immediately subsequent to the start of said enabling signal.

5. Apparatus according to claim 4 wherein:

said means for switching include a phase lag circuit for producing an output signal at said predetermined phase angle relative said A.C. electrical signal.

6. Apparatus according to claim 5 wherein:

said gate means includes an AND gate connected to receive said enabling and voltage signals and disposed to produce an output signal when said voltage signal is above a predetermined amplitude concurrent with said enabling signal.

* * * * *